United States Patent [19]
Brown et al.

[11] Patent Number: 5,991,890
[45] Date of Patent: Nov. 23, 1999

[54] DEVICE AND METHOD FOR CHARACTERIZING SIGNAL SKEW

[75] Inventors: Jeff S. Brown, Fort Collins; Gerald R. Haag; Hiren R. Patel, both of Colorado Springs, all of Colo.

[73] Assignee: LSI Logic Corporation, Milpitas, Calif.

[21] Appl. No.: 09/061,435

[22] Filed: Apr. 16, 1998

[51] Int. Cl.$^6$ .................................................... G06F 11/00
[52] U.S. Cl. ................... 713/503; 713/401; 395/500.07; 702/117
[58] Field of Search ................... 713/503, 401; 702/89, 118, 117; 395/500.05, 500.07

[56] References Cited

U.S. PATENT DOCUMENTS

| | | | |
|---|---|---|---|
| 5,202,857 | 4/1993 | Yanai et al. | 365/233 |
| 5,231,598 | 7/1993 | Vlahos | 364/569 |
| 5,357,523 | 10/1994 | Bogholtz, Jr. et al. | 371/27 |
| 5,477,067 | 12/1995 | Isomura et al. | 357/211 |
| 5,586,307 | 12/1996 | Wong et al. | 395/551 |
| 5,612,924 | 3/1997 | Miyamoto | 365/233.5 |
| 5,614,818 | 3/1997 | Ayat et al. | 325/158.1 |
| 5,692,165 | 11/1997 | Jeddeloh et al. | 713/401 X |
| 5,819,076 | 10/1998 | Jeddeloh et al. | 713/401 |
| 5,857,095 | 1/1999 | Jeddeloh et al. | 713/401 |

*Primary Examiner*—Thomas M. Heckler

[57] ABSTRACT

A device and method for characterizing signal skew between a first signal and a second signal. The device includes a delay chain and a first transition detector in communication with the delay chain. The first transition detector is configured for receiving the first signal and provides a pulse signal to the delay chain upon detecting a transition of the first signal. The device includes a second transition detector which is in communication with a latch and is configured for receiving the second signal. The second transition detector sets the latch upon detecting a transition of the second signal. At least one pass gate is connected to the delay chain and the latch. At least one timing latch is connected to the pass gate for receiving signal skew information between the first and second signals.

25 Claims, 5 Drawing Sheets

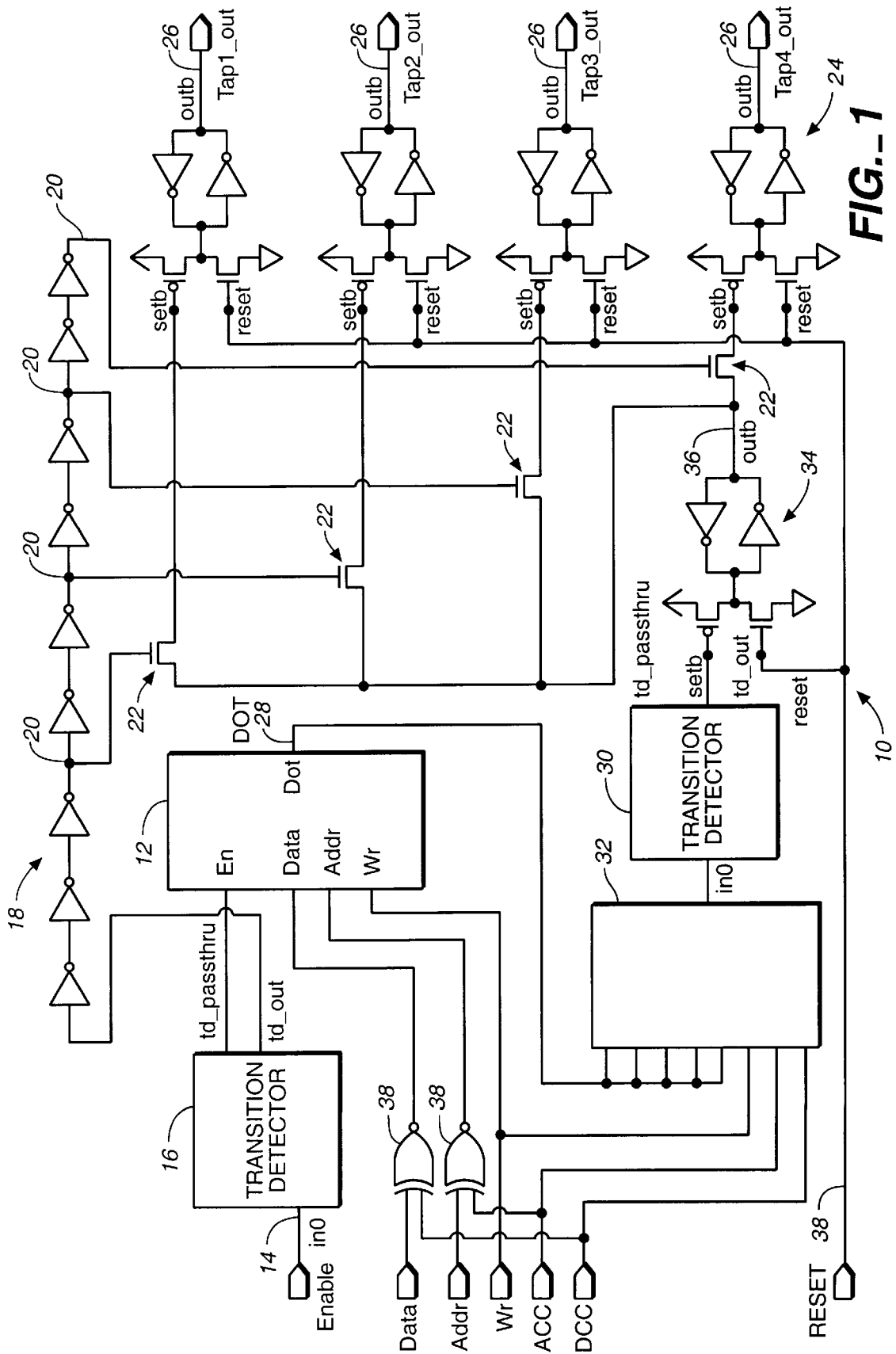
FIG._1

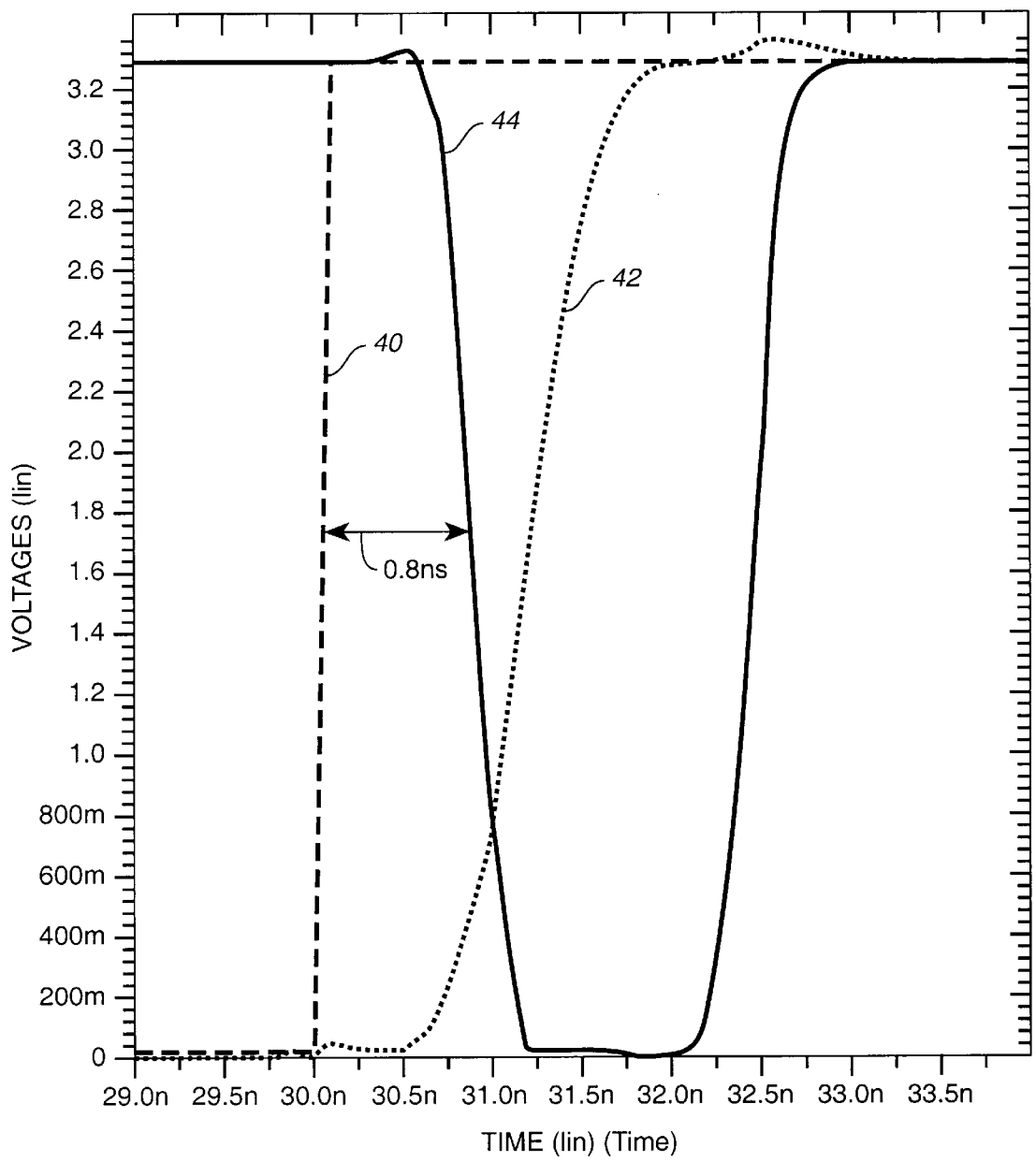
FIG._2

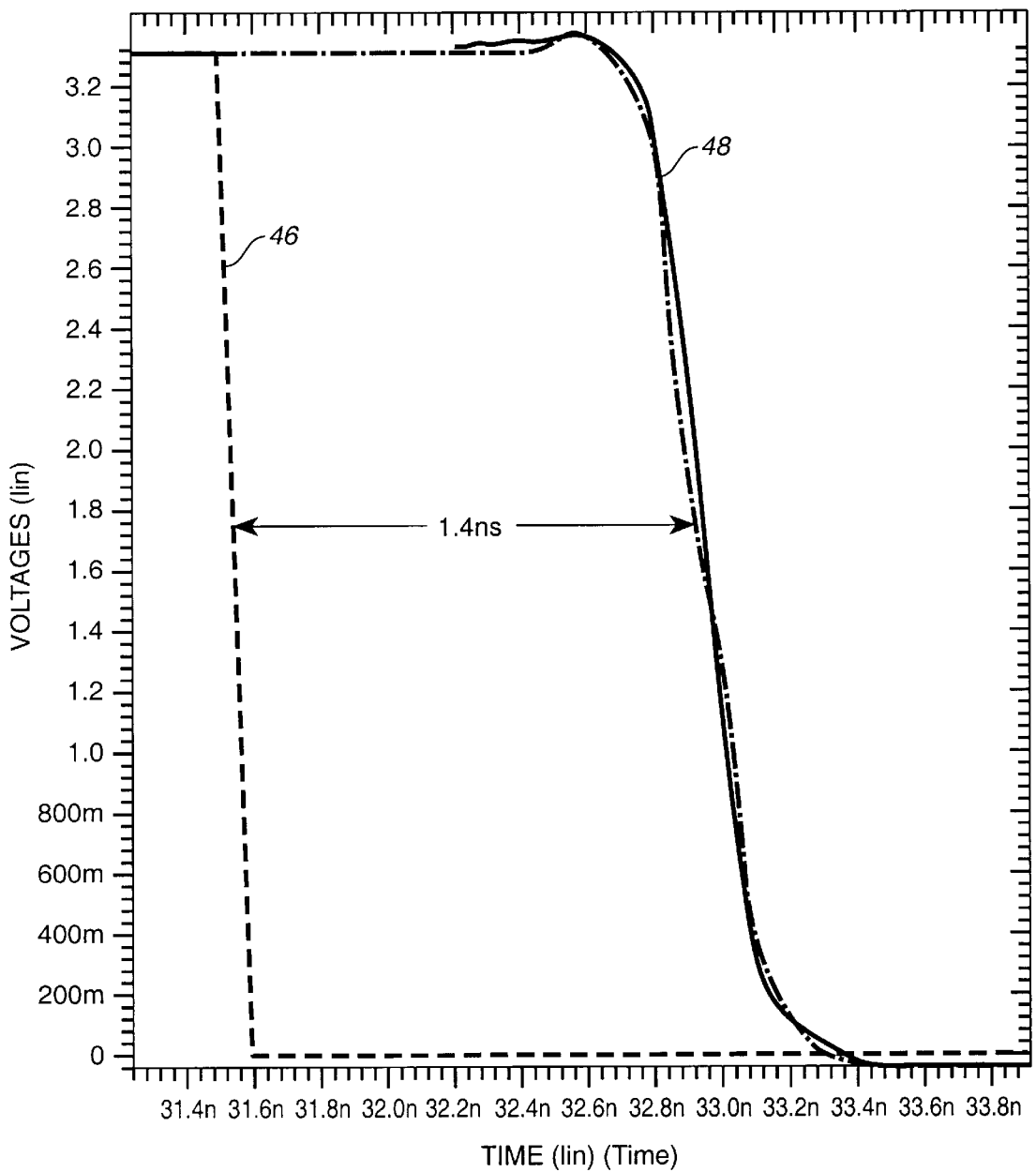
FIG._3

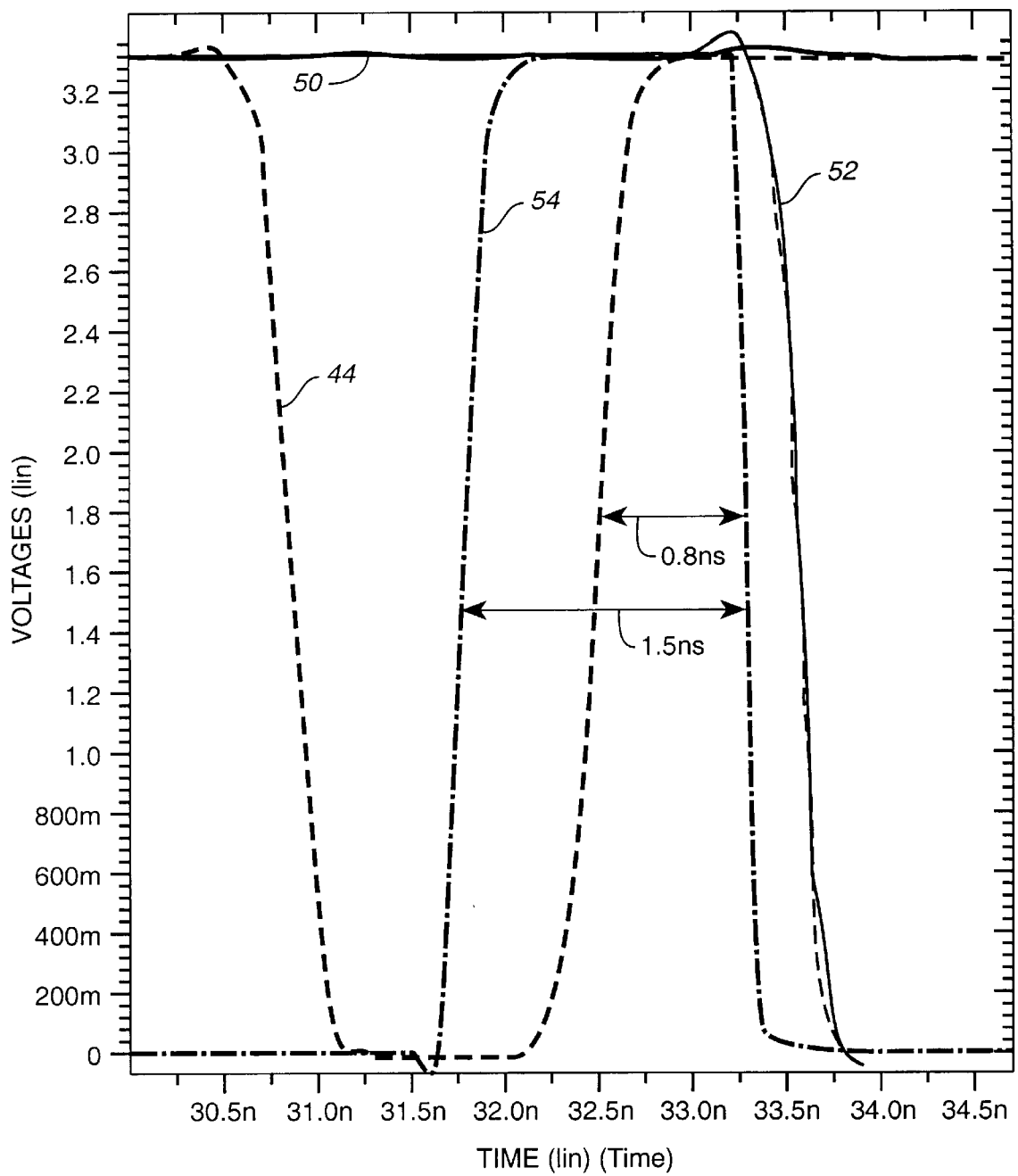
FIG._4

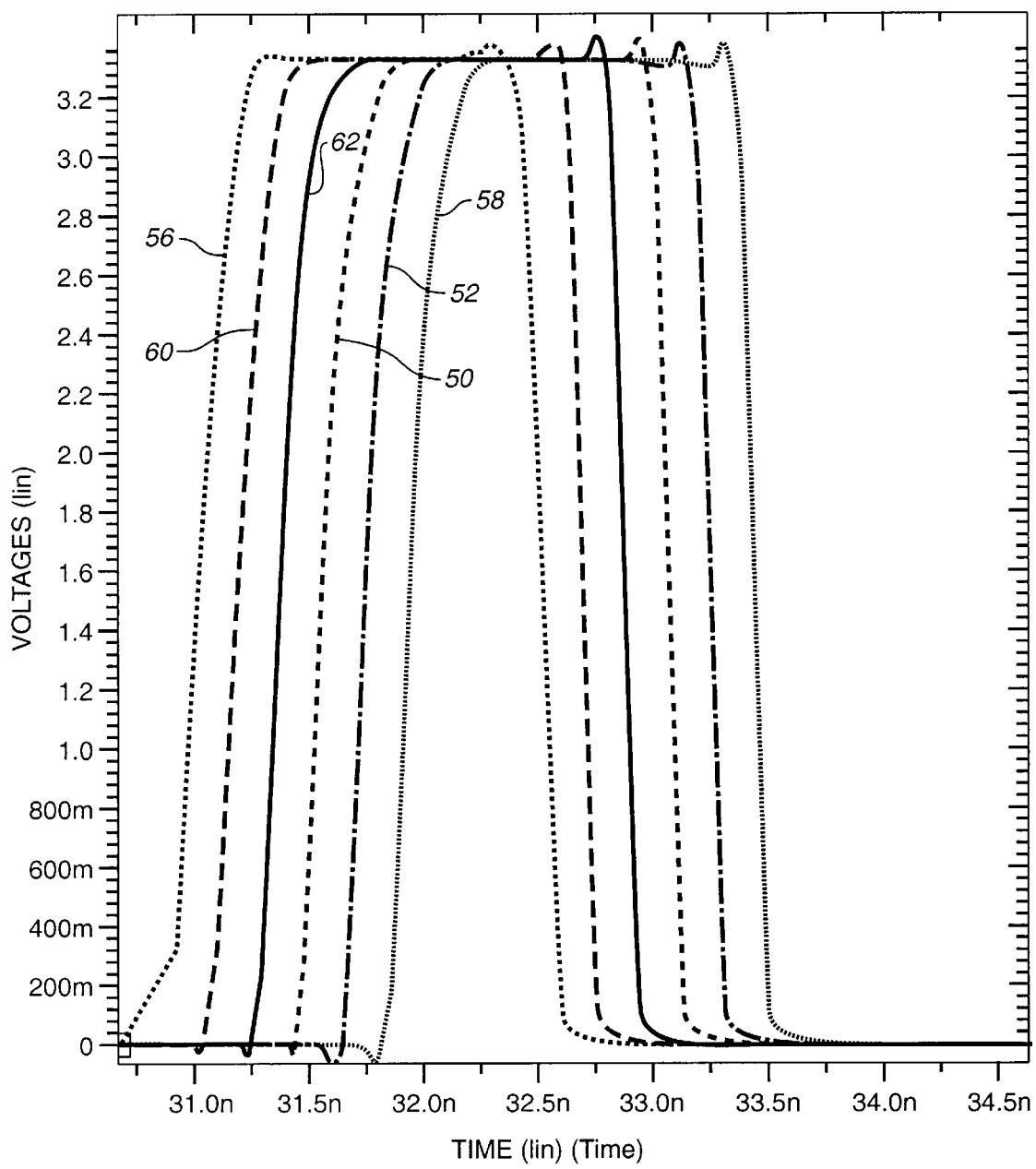
FIG._5

DEVICE AND METHOD FOR CHARACTERIZING SIGNAL SKEW

The present invention relates generally to devices and methods for characterizing signal skew, and more specifically relates to a device and method for characterizing signal skew using a delay chain.

BACKGROUND OF THE INVENTION

A common method of testing memory devices is to place several memory devices within a single die and use multiplexers to route signals on and off the chip to cut down on the number of pads required to read the test results. Due to the large number of memory devices being tested, it proves difficult to route the signals on and off the chip such that signal skew between them does not occur. This limits the amount of characterization information which can be gathered from the test chip. For example, the large skews between the signals at the memory render any setup/hold timing information obtained essentially useless. Additionally, the delay relating to routing the signals on and off the chip inhibits the gathering of access timing information.

OBJECTS AND SUMMARY

It is an object of the present invention to provide a device and method for characterizing signal skew associated with a memory device.

It is a further object of the present invention to provide a device and method for characterizing memory device output events relative to an enable signal of the memory device.

It is a further object of the present invention to provide a device and method for characterizing signal skew of memory device input signals relative to an enable signal of the memory device.

In accordance with these and other objects, the present invention provides a device for characterizing signal skew between a first signal and a second signal. The device includes a delay chain and a first transition detector in communication with the delay chain. The first transition detector is configured for receiving the first signal and provides a pulse signal to the delay chain upon detecting a transition of the first signal. The device includes a second transition detector which is in communication with a latch and is configured for receiving the second signal. The second transition detector sets the latch upon detecting a transition of the second signal. At least one pass gate is connected to the delay chain and the latch. At least one timing latch is connected to the pass gate for receiving signal skew information between the first and second signals.

Preferably, the first signal is an enable signal of a memory device and the second signal is an output signal of the memory device. The first transition detector is connected to an input of the memory device, and a multiplexer is connected to the output of the memory device. The multiplexer is also connected to the second transition detector, between the memory device and the second transition detector. A plurality of pass gates are connected to the delay chain and to the latch. Each pass gate is connected to the delay chain at a different tap point, and the delay chain drives the pass gates. The second transition detector sets the latch and drives the pass gates upon detecting a transition of the second signal. Desirably, a data input and address input of the memory device is in communication with the multiplexer, and an xor gate is provided on the data input and address input and is controlled to toggle the inputs, in order to obtain skew information between these signals and the memory device enable signal. Toggling the address and data inputs with the xor gate limits the skew between them.

Another aspect of the present invention provides a method of characterizing signal skew between a first signal and a second signal. The method includes providing a pulse signal to a delay chain upon detecting a transition of the first signal. A latch is set upon detecting a transition of the second signal. The pulse signal of the delay chain is used to periodically test whether the latch has been set and characterize signal skew between the two signals.

Preferably, a method of characterizing signal skew between a memory device enable signal and a memory device output signal is provided, and the method includes providing a delay chain and providing a pulse signal to the delay chain upon detecting a transition of the memory device enable signal. A latch is set upon detecting a transition of the memory device output signal. The pulse signal of the delay chain is used to periodically test whether the latch has been set and to characterize the signal skew between the memory device enable signal and the memory device output signal. A plurality of pass gates are connected to the delay chain and to the latch. Each pass gate is connected to the delay chain at a different tap point on the delay chain and the delay chain drives the pass gates. A timing latch is connected to each pass gate for receiving signal skew information between the memory device enable signal and memory device output signals. Desirably, the memory device has a data input and an address input and both are in communication with the multiplexer. An xor gate is provided on the data input and address input of the memory device, and the xor gates are controlled to toggle the address input and data input signals so skew information can be obtained with regard to the memory device enable signal.

By characterizing memory device output events relative to an enable signal of the memory device, last data hold times and new data access times, for example, can be effectively characterized.

BRIEF DESCRIPTION OF THE DRAWINGS

The present invention and the advantages thereof will become more apparent upon consideration of the following detailed description when taken in conjunction with the accompanying drawing of which:

FIG. 1 is a schematic diagram of a characterization block in accordance with an embodiment of the present invention; and FIGS. 2 through 5 are charts of waveforms which relate to an Hspice simulation which was run utilizing a characterization block similar to that depicted in FIG. 1.

DETAILED DESCRIPTION OF AN EMBODIMENT OF THE INVENTION

FIG. 1 illustrates a device in accordance with an embodiment of the present invention. Specifically, the device is a characterization block 10 associated with a memory block or device 12. The characterization block 10 is configured for characterizing signal skew relative to an enable signal 14 of the memory block 12. Characterizing the skew of certain signals relative to the enable signal 14 of the memory device 12 provides certain advantages. For example, by characterizing memory device events relative to the enable signal 14, a good estimate of setup/hold timing information as well as actual access timing information can be more efficiently extracted.

As shown in FIG. 1, the characterization block 10 provides that the enable signal input 14 of the memory device 12 is connected to a transition detector 16 which initially receives the memory device enable signal 14. A delay chain 18 is connected to the transition detector 16 such that the transition detector 16 can communicate a pulse to the delay chain 18 upon detecting an enable signal transition.

The delay chain 18 includes several tap points 20 which provide that the pulse signal, which is initially supplied to the delay chain 18 by the transition detector 16, can be used to test whether some other event has occurred, such as events relating to an input or an output of the memory device 12. Each tap point 20 is connected to a pass gate 22, such as to an n-channel pass gate, and each pass gate 22 is connected to one of a plurality of timing latches 24. Each timing latch 24 may be constructed to fit below the delay chain 18 at each corresponding delay chain tap point 20, and a multiplexer (not shown) may be connected to the outputs 26 of the timing latches 24. Because a delay chain 18 is utilized to characterize the signals relative to each other, additional characterization structure is preferably provided on the die so that the delay associated with the delay chain 18 can be characterized. For example, a library characterization vehicle can be employed as one having ordinary skill in the art would recognize.

The characterization block 10 preferably provides that the memory device outputs 28 can also be characterized relative to the enable signal 14. To this end, a second transition detector 30 is connected to a multiplexer 32 which is connected to the data output lines 28 of the memory device 12. The transition detector 30 drives a latch 34 connected thereto upon detecting a transition of the memory device outputs 28. As shown, an output 36 of the latch 34 is connected to each of the pass gates 22, and a reset signal line 38 is connected to each of the latches 24.

The described connections provide that the pulse signal from the delay chain 18 can be used to find the time at which the output 28 of the memory device 12 transitions. For example, the fastest output data transition will indicate the last data hold time information ($T_{odh}$), while the slowest output data transition will indicate the access timing information ($T_{acc}$). The multiplexer 32 between the memory device 12 and the transition detector 30 provides that one bit can be analyzed at a time to limit the die area consumed by the characterization block 10.

In operation, the enable signal 14 drives the transition detector 16 and the delay chain 18. Via the specified tap points 20 of the delay chain 18, the delay chain 18 drives the pass gates 22. When the second transition detector 30 detects a specified memory device output event, the transition detector 30 will set the latch 34 connected thereto which drives the pass gates 22. Once the first timing latch 24 is set, the pulse in the delay chain 18 will carry along the delay chain 18 and through the remaining pass gates to the other timing latches. Each of the timing latches 24 is initially set low. As mentioned, a multiplexer (not shown) can be connected to the outputs 26 of the timing latches 24 to see which times passed and which times failed. By using a multiplexer on the outputs 26 of the timing latches 24, one pad can be used to examine all of the results, and the die area consumed by the characterization block 10 can be reduced.

Predicted performance of the particular memory device can be used to select a range of delay chain tap points 20 based upon a pre-determined error range. In this manner, timing latches 24 will not generally be needed for every delay chain tap point 20, and may be concentrated in a specific area. For example, timing latches 24 may be provided only between delay chain tap points 20 corresponding to between 2.5 ns and 7.5 ns. Preferably, even those delay chain tap points 20 which are not connected to a timing latch 24 still drive a pass gate 22 connected thereto since this keeps the loading in the delay chain 18 substantially constant. Also, to optimize the characterization block 10 for use with memory devices 12 having large word widths, knowledge of the design of the particular memory device 12 itself can be used to select the small set of bits which are most likely to limit both $T_{odh}$ and $T_{acc}$.

As mentioned, preferably the characterization block 10 characterizes signal skew of the memory device output signal 28 relative to the enable signal 14 of the memory device. However, the configuration block 10 illustrated in FIG. 1 also provides that the signal skew of input signals of the memory device 12 can be characterized relative to the memory device enable signal 14. To this end, certain input signals (for example, "Data", "Addr" and "Wr" depicted in FIG. 1) can be arranged to drive the memory device inputs and also drive the multiplexer 32 and transition detector 30. While all memory device inputs can be characterized, the preferred characterization block configuration is as shown in FIG. 1 with xor gates 38 being provided on each of the data ("Data") and address ("Addr") input signal lines. As shown in FIG. 1, the data and address inputs are preferably driven by signals "ACC" and "DCC". For setup/hold time characterization, the ACC and DCC signals can be used to toggle the data and address signals with substantially zero skew therebetween. Consequently, only an enable signal skew relative to the ACC and DCC signals would be needed to determine all address and data set/up hold times.

Ideally, the delay from the enable signal 14 to the memory device 12 would be substantially the same as the delay from the memory output lines 28 to the latch 34 connected to the transition detector 30. However, while the enable signal 14 passes through the transition detector 16 and delay chain 18 before reaching the pass gates 22, the outputs 28 of the memory device 12, as well as the input signals which bypass the memory device 12, pass through the multiplexer 32, transition detector 30, and the latch 34 connected thereto before arriving at the pass gates 22. While the delays associated with the transition detectors 16 and 30 will effectively cancel each other, the signals from the delay chain 18 and the latch 34 arriving at the pass gates 22 will actually appear to lag each other by a delay time equal to a delay associated with the multiplexer 32 and a delay associated with the latch 34. Of course, additional characterization structures can be included on the die in order to characterize these delays.

FIGS. 2 through 6 relate to an Hspice simulation which was run utilizing a characterization block similar to that depicted in FIG. 1, but which included eight tap points along the delay chain and had a pre-determined enable signal to memory device output signal skew of 1.5 ns.

FIG. 2 is a chart of waveforms corresponding to the signals related to the first transition detector 16 which is connected to the memory device enable signal 14. Waveform 40 corresponds to the enable signal 14 which, as shown, rises at time=30 ns. Waveform 42 corresponds to the delayed version of the enable signal 14—that which passes through the transition detector 16 to the memory device 12. Waveform 44 corresponds to the input into the delay chain 18. As shown in FIG. 2, a delay of about 0.8 ns relating to the transition detector 16 can be seen between the time the enable signal rises (waveform 40) until the pulse starts (waveform 44) carrying into the delay chain 18.

FIG. 3 is a chart of waveforms corresponding to the second transition detector 30 which, as mentioned, is preferably connected to the certain input signals and outputs of the memory device 12 which are sought to be characterized. Waveform 46 corresponds to a signal driving the multiplexer 32 while waveform 48 corresponds to the latch output signal 35 which drives the pass gates 22. As shown in FIG. 3, a delay relating to the multiplexer 32, second transition detector 30 and latch 34 is about 1.4 ns. Comparing FIG. 3 to FIG. 2 and the delays shown therein, a delay which is associated with the latch 34 connected to the transition detector 30 and the multiplexer 32 can be calculated to be approximately 0.6 ns (1.4 ns–0.8 ns=0.6 ns). While, as mentioned, the delays associated with the transition detectors 16 and 30 will effectively cancel each other, the delay which is associated with the latch 34 and multiplexer 32 should be characterized.

FIG. 4 is a chart of waveforms corresponding to certain output signals and delays associated therewith. Waveform 44 (also depicted in FIG. 2) corresponds to the pulse signal provided to the delay chain 18 by the transition detector 16. Waveforms 50 and 52 correspond to two of the timing latch output signals (for the fourth and fifth tap point on the delay chain 18, respectively). With regard to the fourth tap point, waveform 50, the output from the latch 34 was too slow and did not drop the timing latch output signal. With regard to the fifth tap point, waveform 52, the timing latch output signal is dropped. This fifth timing latch is associated with the signal in the delay chain depicted in FIG. 4 as waveform 54. As shown, waveform 54 trails waveform 44 by approximately 0.8 ns. Because that which trips the first timing latch is the lattermost portion of a delay chain pulse, the delay from the input event to the falling edge of that pulse is the delay corresponding to the signal skew information. The delay chain delay plus the width of the pulse is or 2.3 ns (1.5 ns pulsewidth plus the 0.8 ns delay indicated in FIG. 4). Knowing that the latch 34 and multiplexer 32 connected to the transition detector 31) has delayed the output by 0.6 ns, the characterized "enable to output" signal skew is 0.8 ns (the delay associated with the delay chain 18)+1.5 ns (the pulse width depicted in FIG. 4)–0.6 ns (the delay associated with the latch 34 and multiplexer 32), or 1.7 ns. The overshoot of 0.2 ns is due to the time it takes to set one of the timing latches 24 (which could, if desired, be also characterized).

With regard to characterization time granularity, FIG. 5 depicts a pulse delay of approximately 0.2 ns between stages using the layout created for the simulation (with waveform 56 relating to the first delay chain tap point, waveform 60 relating to the second delay chain tap point, waveform 62 relating to the third delay chain tap point, waveform 50 relating to the fourth delay chain tap point, waveform 52 relating to the fifth delay chain tap point, and waveform 58 relating to the sixth delay chain tap point). While the pulse width generated by the transition detectors 16 and 30 is unknown, an internal characterization scheme or E beam could be used to determine its width as breaking out the delay path internal to the transition detector which effectively sets the width and characterizes it in a manner similar to the delay chain.

By providing that signal skew is characterized using a delay chain as described above, many advantages are realized. For example, both last data hold times and new data access times can be characterized in silicon. Input setup/hold times can also be characterized relative to the enable signal.

While a preferred embodiment of the present invention is shown and described, it is envisioned that those skilled in the art may devise various modifications of the present invention without departing from the spirit and scope of the appended claims.

What is claimed is:

1. A device for characterizing signal skew between a first signal and a second signal, said device comprising:

a delay chain;

a first transition detector in communication with said delay chain and configured for receiving said first signal, said first transition detector providing a pulse signal to said delay chain upon detecting a transition of said first signal;

a latch;

a second transition detector in communication with said latch and configured for receiving said second signal, said second transition detector setting said latch upon detecting a transition of said second signal;

at least one pass gate connected to said delay chain and said latch; and at least one timing latch connected to said pass gate for receiving signal skew information between said first and second signals.

2. The device of claim 1, further comprising a memory device in communication with said second transition detector.

3. The device of claim 1, further comprising a memory device having at least one input and at least one output, said second transition detector in communication with said output of said memory device.

4. The device of claim 3, wherein said first signal is an enable signal of said memory device.

5. The device of claim 4, wherein said first transition detector is connected to said input of said memory device.

6. The device of claim 5, further comprising a multiplexer connected to said output of said memory device and to said second transition detector, wherein said multiplexer is between said memory device and said second transition detector.

7. The device of claim 6, further comprising a plurality of pass gates connected to said delay chain and said latch, each of said pass gates connected to said delay chain at a different tap point on said delay chain, said delay chain driving said pass gates.

8. The device of claim 7, wherein said second transition detector sets said latch and drives said pass gates upon detecting a transition of said second signal.

9. The device of claim 1, further comprising a multiplexer configured for receiving said second signal and connected to said second transition detector, wherein said multiplexer is between said second signal and said second transition detector.

10. The device of claim 9, further comprising a memory device having a data input and an address input, said data input and said address input of said memory device in communication with said multiplexer.

11. The device of claim 10, further comprising an or gate on each of said data input and said address input, said xor gates controlled to toggle said address input and said data input, wherein said xor gate control signals are in communication with said multiplexer.

12. A device for characterizing signal skew between a memory device enable signal and a memory device output signal, said device comprising:

a delay chain;

a memory device having at least one input and at least one output, a first transition detector in communication with said delay chain and configured for receiving said enable signal of said memory device, wherein said first transition detector is connected to said input of said memory device and provides a pulse signal to said delay chain upon detecting a transition of said enable signal;

a latch;

a second transition detector in communication with said latch;

a plurality of pass gates connected to said delay chain and said latch;

at least one timing latch connected to said pass gates for receiving signal skew information between said signals;

a multiplexer connected to said output of said memory device and to said second transition detector, wherein said multiplexer is between said memory device and said second transition detector, wherein said second transition detector receives said output signal from said memory device through said multiplexer and said second transition detector sets said latch upon detecting a transition of said memory device output signal; and each of said pass gates connected to said delay chain at a different tap point on said delay chain, wherein said delay chain drives said pass gates, and wherein said second transition detector sets said latch and drives said pass gates upon detecting a transition of said memory device output signal.

13. The device of claim 12, wherein said memory device has a data input and an address input, wherein said data input and said address input of said memory device are in communication with said multiplexer.

14. The device of claim 13, further comprising an xor gate on each of said data input and said address input, wherein said xor gates are controlled to toggle said address input and said data input, and wherein said xor gate control signals are in communication with said multiplexer.

15. A method of characterizing signal skew between a first signal and a second signal, said method comprising:

providing a delay chain;

detecting a transition of said first signal;

providing a pulse signal to said delay chain upon detecting said transition of said first signal;

detecting a transition of said second signal;

setting a latch upon detecting said transition of said second signal; and using said pulse signal of said delay chain to periodically test whether said latch has been set and characterize signal skew between said first and second signals.

16. The method of claim 15, further comprising providing a plurality of pass gates connected to said delay chain and said latch, wherein each of said pass gates is connected to said delay chain at a different tap point on said delay chain and said delay chain drives said pass gates.

17. The method of claim 16, further comprising providing a timing latch connected to each pass gate for receiving signal skew information between said first and second signals.

18. The method of claim 17, further comprising providing a multiplexer connected to said timing latches for transferring said signal skew information.

19. The method of claim 16, further comprising providing a multiplexer configured for receiving said second signal, wherein said multiplexer is connected to said second transition detector and receives said second signal.

20. The method of claim 19, further comprising providing a memory device having a data input and an address input, wherein said data input and said address input of said memory device are in communication with said multiplexer.

21. The method of claim 20, further comprising toggling said address input and said data input of said memory device.

22. The method of claim 21, further comprising providing an xor gate on each of said data input and an address input, and controlling said xor gates to toggle said address input and said data input, wherein said xor gate control signals are in communication with said multiplexer.

23. A method of characterizing signal skew between a memory device enable signal and a memory device output signal, said method comprising:

providing a delay chain;

providing a memory device having at least one input and at least one output;

detecting a transition of said memory device enable signal;

providing a pulse signal to said delay chain upon detecting said transition of said enable signal;

detecting a transition of an output signal of said memory device;

setting a latch upon detecting said transition of said memory device output signal;

using said pulse signal of said delay chain to periodically test whether said latch has been set and characterize signal skew between said memory device enable signal and said memory device output signal;

providing a plurality of pass gates connected to said delay chain and said latch, wherein each of said pass gates is connected to said delay chain at a different tap point on said delay chain and said delay chain drives said pass gates; and providing a timing latch connected to each pass gate for receiving signal skew information between said memory device enable signal and said memory device output signal.

24. The method of claim 23, wherein said memory device has a data input and an address input, wherein said data input and said address input of said memory device are in communication with said multiplexer.

25. The method of claim 24, further comprising providing an xor gate on each of said data input and said address input and controlling said xor gates to toggle said address input and said data input, wherein said xor gate control signals are in communication with said multiplexer.

* * * * *